(12) United States Patent
Fiedler

(10) Patent No.: US 9,455,846 B2
(45) Date of Patent: Sep. 27, 2016

(54) DECISION FEEDBACK EQUALIZATION

(71) Applicant: Microsoft Technology Licensing, LLC, Redmond, WA (US)

(72) Inventor: Alan S. Fiedler, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/626,783

(22) Filed: Feb. 19, 2015

(65) Prior Publication Data

US 2016/0248608 A1      Aug. 25, 2016

(51) Int. Cl.
*H04L 27/06*      (2006.01)
*H04B 1/10*       (2006.01)
*H04L 25/03*      (2006.01)

(52) U.S. Cl.
CPC .............................. *H04L 25/03057* (2013.01)

(58) Field of Classification Search
USPC ........ 375/211, 219, 220, 221, 222, 229–236, 375/240, 240.26–240.29, 285, 295, 316, 375/324, 338, 347, 348, 350
See application file for complete search history.

(56) References Cited

U.S. PATENT DOCUMENTS

| 7,443,913 | B2 | 10/2008 | Bhakta et al. | |
|---|---|---|---|---|
| 7,539,243 | B1 | 5/2009 | Toifl et al. | |
| 7,809,054 | B2 | 10/2010 | Carballo et al. | |
| 8,325,832 | B2 * | 12/2012 | Amirkhany | 375/260 |
| 8,477,834 | B2 * | 7/2013 | Leibowitz et al. | 375/233 |
| 8,837,571 | B1 | 9/2014 | Ke et al. | |
| 8,929,496 | B2 * | 1/2015 | Lee et al. | 375/355 |
| 9,071,481 | B2 * | 6/2015 | Kaviani et al. | |
| 2003/0189996 | A1 * | 10/2003 | Shanbhag et al. | 375/348 |
| 2008/0056425 | A1 * | 3/2008 | Betts et al. | 375/371 |
| 2008/0069198 | A1 * | 3/2008 | Bhoja et al. | 375/233 |
| 2008/0310569 | A1 | 12/2008 | Takeuchi | |
| 2009/0252215 | A1 | 10/2009 | Bulzacchelli et al. | |
| 2010/0135378 | A1 * | 6/2010 | Lin et al. | 375/233 |
| 2010/0329325 | A1 * | 12/2010 | Mobin et al. | 375/232 |
| 2011/0090947 | A1 * | 4/2011 | Peng et al. | 375/233 |
| 2011/0243215 | A1 * | 10/2011 | Wu et al. | 375/233 |
| 2012/0128055 | A1 | 5/2012 | Jiang | |

(Continued)

OTHER PUBLICATIONS

Alan S. Fiedler, "Multi-phase clock generation", U.S. Appl. No. 14/476,627, Sep. 3, 2014, 37 pages.

(Continued)

*Primary Examiner* — Linda Wong
(74) *Attorney, Agent, or Firm* — Gregg Wisdom; Judy Yee; Micky Minhas

(57) ABSTRACT

A signal sampling system that includes N samplers is disclosed. Each sampler includes a data input having a decision logic level threshold, a plurality of offset control inputs, a plurality of offset magnitude inputs, an un-buffered output, and a buffered output. Each sampler further includes circuitry coupled between the inputs and outputs that is configured to cause a time delay from an input signal transition to an output signal transition such that, after an offset control input transitions from a first voltage to a second voltage, the decision logic level threshold changes in a time substantially less than one gate delay, and after the sample clock transitions from a first logic state to a second logic state, the un-buffered output transitions within a time substantially equal to one gate delay and the buffered output transitions within a time substantially equal to two gate delays.

20 Claims, 7 Drawing Sheets

(56) References Cited

U.S. PATENT DOCUMENTS

| | | | |
|---|---|---|---|
| 2012/0224621 A1* | 9/2012 | Stojanovic et al. | 375/233 |
| 2013/0007500 A1 | 1/2013 | Fiedler | |
| 2013/0107935 A1 | 5/2013 | Zhou et al. | |
| 2013/0111307 A1 | 5/2013 | Zhou et al. | |
| 2013/0259162 A1 | 10/2013 | Qin et al. | |
| 2014/0169438 A1* | 6/2014 | Lin et al. | 375/232 |
| 2014/0226707 A1* | 8/2014 | Kaviani et al. | 375/233 |
| 2015/0092898 A1* | 4/2015 | Lee et al. | 375/354 |

OTHER PUBLICATIONS

Pozzoni, et al., "A Multi-Standard 1.5 to 10 Gb/s Latch-Based 3-Tap DFE Receiver with a SSC Tolerant CDR for Serial Backplane Communication", In IEEE Journal of Solid-State Circuits, vol. 44, Issue 4, Apr. 2009, 10 pages.

Seong, et al., "A 10-Gb/s Adaptive Look-Ahead Decision Feedback Equalizer with an Eye-Opening Monitor", In IEEE Transactions on Circuits and Systems II: Express Briefs, vol. 59, Issue 4, Apr. 2012, 5 pages.

Dickson, et al., "An 8 10-Gb/s Source-Synchronous I/O System Based on High-Density Silicon Carrier Interconnects", In Proceedings of Symposium on VLSI Circuits Jun. 15, 2011, pp. 80-81.

Gangasani, et al., "A 16-Gb/s Backplane Transceiver with 12-Tap Current Integrating DFE and Dynamic Adaptation of Voltage Offset and Timing Drifts in 45-nm SOI CMOS Technology", In IEEE Journal of Solid-State Circuits, vol. 47, Issue 8, Aug. 2012, pp. 1828-1841.

Spagna, et al., "A 78mW 11.8Gb/s serial link transceiver with adaptive RX equalization and baud-rate CDR in 32nm CMOS", In IEEE International Solid-State Circuits Conference Digest of Technical Papers, Feb. 7, 2010, 3 pages.

"PCI Express® Base Specification Revision 3.0", In Proceedings of PCI-SIG, Nov. 10, 2010, 860 pages. (Submitted in three parts).

Stojanovic, et al., "Optimal Linear Precoding with Theoretical and Practical Data Rates in High-Speed Serial-Link Backplane Communication", In IEEE International Conference on Communications, vol. 5, Jun. 20, 2004, pp. 2799-2806.

Madden, et al., "Jitter Amplification Considerations for PCB Clock Channel Design", In IEEE 16th Topical Meeting Electrical Performance of Electrnoic Packaging, Oct. 29, 2007, pp. 135-138.

Reutemann, et al., "A 4.5 mW/Gb/s 6.4 Gbls 22+1-Lane Source Synchronous Receiver Core with Optional Cleanup PLL in 65 nm CMOS", In IEEE Journal of Solid-State Circuits, vol. 45, Issue 12, Dec. 2010, pp. 2850-2860.

Galal, et al., "Broadband ESD Protection Circuits in CMOS Technology", In IEEE International Solid-State Circuits Conference Digest of Technical Papers, Feb. 13, 2003, 10 pages.

McCreary, et al., "All-MOS Charge Redistribution Analog-to-Digital Conversion Techniques—Part I", In IEEE Journal of Solid-State Circuits, vol. SC 10, No. 6, Dec. 1975, pp. 371-379.

Neyestanak, et al., "A 6.0-mW 10.0-Gb/s Receiver with Switched-Capacitor Summation DFE", In IEEE Journal of Solid-State Circuits, vol. 42, Issue 4, Apr. 2007, pp. 889-896.

Honarvar, et al., "A 15Gb/s 0.5mW/Gb/s 2-tap DFE Receiver with Far-End Crosstalk Cancellation", In IEEE International Solid-State Circuits Conference Digest of Technical Papers, Feb. 20, 2011, pp. 3 pages.

Park, et al., "A 7Gb/s 9.3mW 2-Tap Current-Integrating DFE Receiver", In IEEE International Solid-State Circuits Conference Digest of Technical Papers, Feb. 11, 2007, 3 pages.

Dickson, et al., "A 12-Gb/s 11-mW Half-Rate Sampled 5-Tap Decision Feedback Equalizer with Current-Integrating Summers in 45-nm SOI CMOS Technology", In IEEE Symposium on VLSI Circuits, Jun. 18, 2008, pp. 58-59.

Hidaka, et al., "A 4-Channel 1.25-10.3 Gb/s Backplane Transceiver Macro with 35 dB Equalizer and Sign-Based Zero-Forcing Adaptive Control", In IEEE Journal of Solid-State Circuits, vol. 44, No. 12, Dec. 2009, pp. 3547-3559.

Hidaka, et al., "A 4-Channel 10.3Gb/s Transceiver with Adaptive Phase Equalizer for 4-to-41dB Loss PCB Channel", In IEEE International Solid-State Circuits Conference Digest of Technical Papers, Feb. 20, 2011, 3 pages.

Bulzacchelli, et al., "A 78mW 11.1Gb/s 5-Tap DFE Receiver with Digitally Calibrated Current-Integrating Summers in 65nm CMOS", In IEEE International Solid-State Circuits Conference Digest of Technical Papers, Feb. 8, 2009, 3 pages.

Chen, et al., "A Scalable 3.6-to-5.2mW 5-to-10Gb/s 4-Tap DFE in 32nm CMOS", In IEEE International Solid-State Circuits Conference Digest of Technical Papers, Feb. 8, 2009, 2 pages.

Thakkar, et al., "A 10Gb/s 45mW Adaptive 60GHz Baseband in 65nm CMOS", In Proceedings of Symposium on VLSI Circuits, Jun. 15, 2011, pp. 24-25.

"Hyper-Transport Link Specification, Rev. 3.10c", In Technical Document HyperTransport Consortium, Mar. 27, 2014, 22 pages.

Toifl, T. et al., "A 2.6 mW/Gbps 12.5 Gbps RX With 8-Tap Switched-Capacitor DFE in 32 nm CMOS", IEEE Journal of Solid-State Circuits, vol. 47, Issue 4, Apr. 2012, 14 pages.

ISA European Patent Office, International Search Report and Written Opinion Issued in Application No. PCT/US2016/016038, May 11, 2016, WIPO, 14 pages.

* cited by examiner

DECISION FEEDBACK EQUALIZATION

BACKGROUND

High-speed I/O (input/output) data circuits for transferring large volumes of data at high speeds across short distances may suffer from various performance issues. For example, data received at a high-speed I/O circuit may suffer from distortion arising from the transmission channel.

SUMMARY

Embodiments are disclosed that relate to a signal sampling system that includes decision feedback equalizers for use in high speed I/O circuitry. One disclosed example provides a signal sampling system that includes N latching samplers, wherein N represents an integer equal to or greater than four, and wherein each sampler includes a sample clock input to couple to a sample clock, and the sample clocks of the N samplers are substantially equally spaced in phase through 360 degrees. Each sampler further includes a data input having a decision logic level threshold (herein sometimes referred to as the sampler's decision logic level threshold), a plurality of offset control inputs, a plurality of offset magnitude inputs, an un-buffered output, and a buffered output. Each sampler further includes circuitry coupled between the inputs and outputs that causes a time delay from an input signal transition to an output signal transition such that, after an offset control input transitions from a first voltage to a second voltage, the decision logic level threshold changes in a time substantially less than one gate delay, and after the sample clock transitions from a first logic state to a second logic state, the un-buffered output transitions within a time substantially equal to one gate delay and the buffered output transitions within a time substantially equal to two gate delays. In the discussion, unless otherwise stated, adjectives such as "substantially" and "about" modifying a condition or relationship characteristic of a feature or features of an embodiment of the disclosure are understood to mean that the condition or characteristic is defined to within tolerances that are acceptable for operation of the embodiment for an application for which it is intended.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to embodiments that solve any or all disadvantages noted in any part of this disclosure.

DETAILED DESCRIPTION

Figure 1:
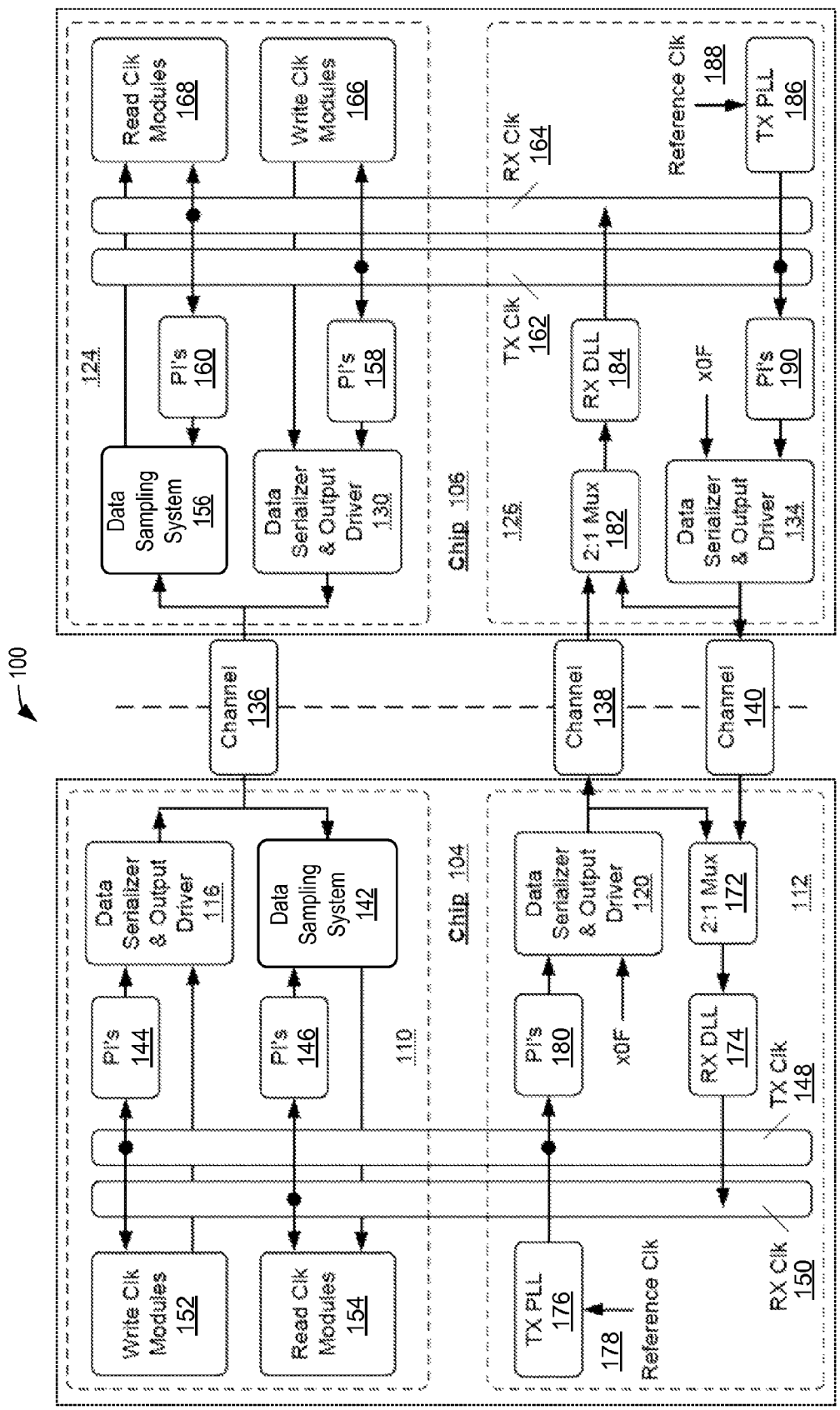
FIG. 1 shows a block diagram of an example high-speed I/O data system.

One type of equalization that is used to correct for distortion arising from a data transmission channel is decision feedback equalization (DFE). DFE circuitry is often integrated with a receive amplifier that precedes one or more receive samplers, wherein the sampler outputs are summed with the received signal, and the summed signal is amplified and directed to the receive samplers.

However, the use of a receive amplifier as an analog front end (AFE) for a DFE may contribute to power consumption, occupy substantial area on a chip, and add unacceptable latency in feedback equalization signals. As such, examples are disclosed herein that relate to the integration of DFE circuitry with a sampler circuit. The integration of DFE circuitry with sampler circuitry allows the omission of an AFE for the DFE, and therefore helps reduce power, area and feedback equalization signal latency.

Prior to discussing the integration of DFE circuitry with sampler circuitry, an example high-speed I/O data system 100 is described with reference to FIG. 1. System 100 includes a first chip 104 having a data circuit 110 and clock circuit 112, and a second chip 106 having a data circuit 124 and clock circuit 126. It is to be understood that chips 104 and 106 may represent any suitable electrical component(s), such as microchips, processing cores, and other circuit elements.

Data circuit 110 includes a data serializer and output driver 116 and data sampling system 142. Data circuit 124 includes a data serializer and output driver 130 and data sampling system 156. The data circuit 110 and clock circuit 112 of the first chip 104, and the data circuit 124 and clock circuit 126 of the second chip 106 form a chip-to-chip I/O data interface via data channel 136 and clock channels 138 and 140.

System 100 includes data channel 136 for data communication between the data serializer and output driver 116 of the first data circuit 110 and the data sampling system 156 of the second data circuit 124, and/or for data communication between the data serializer and output driver 130 of the second data circuit 124 and the data sampling system 142 of first data circuit 110. Data sampling systems 142 and 156 include the aforementioned DFE circuitry. Data channel 136 may be implemented as a unidirectional or bi-directional data channel. System 100 also includes unidirectional clock channels 138 and 140 for transmitting clock signals between the first chip 104 and the second chip 106.

The data circuit 110 of the first chip 104 also includes transmitter clock phase interpolators (PIs) 144, receiver clock phase interpolators 146, a transmitter clock distribution 148, and a receiver clock distribution 150. The data circuit 110 further includes write clock modules 152 and read clock modules 154. Likewise, the data circuit 124 of the second chip 106 includes transmitter clock phase interpolators 158, receiver clock phase interpolators 160, a transmitter clock distribution 162, and a receiver clock distribution 164. The data circuit 124 further includes write clock modules 166 and read clock modules 168.

Receiver clock distribution 150 and 164 provide a multi-phase clock signal to data sampling systems 142 and 156, via receiver clock phase interpolators 146 and 160, to enable the time-accurate sampling of data signals received across channel 136.

The clock circuit 112 of the first chip 104 is configured to receive clock signals from clock circuit 126 via a multiplexer 172, and to generate, via circuitry such as a delay locked loop (RX DLL), a phase-locked loop (PLL), or an injection locked oscillator (ILO), a multi-phase clock signal from the received clock signals. Multiplexer 172 enables the use of the locally generated transmit clock (e.g., the clock coupled to channel 138) in place of the incoming receive clock (e.g., via channel 140).

The multi-phase clock signal is provided to sampling system 142 via the receiver clock distribution 150 and the receiver clock phase interpolator 146. The illustrated clock circuit 112 also includes a data transmission clock generator comprising a transmitter phase locked loop (TX PLL) 176 receiving clock data from a reference clock 178, clock phase interpolator 180, and the above-mentioned data serializer and output driver 120. Clock circuit 112 interfaces with clock circuit 126 via channels 138 and 140.

The data circuit 124 of the second chip 106 is symmetric to the data circuit 110 of first chip 104. Similarly, the clock circuit 126 of the second chip 106 is symmetric to the clock circuit 112 of the first chip 104. Thus, the clock circuit 126 of the second chip 106 includes a receiver clock circuit comprising a multiplexer 182 and DLL 184 to generate a multi-phase clock signal for samplers 156 via receiver clock distribution 164 and receiver clock phase interpolators 160. The clock circuit 126 also includes a transmitter clock circuit comprising a transmitter phase locked loop (TX PLL) 186 that receives a reference clock input 188, phase interpolators 190, and a data serializer and output driver 134 to provide a clock signal for data transmission.

Figure 2:
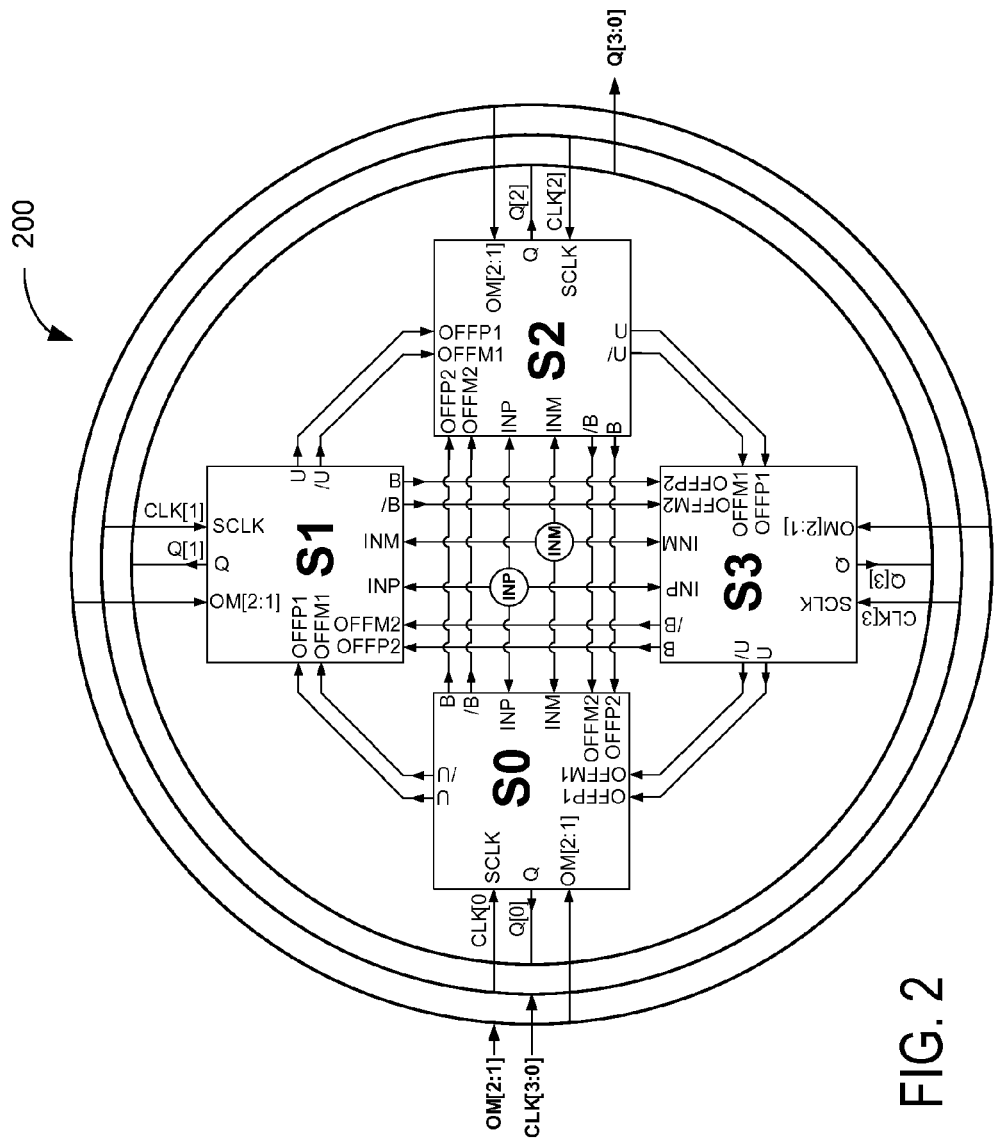
FIG. 2 shows a block diagram of an example of the data sampling system of FIG. 1.

FIG. 2 shows an example data signal sampling system including example circuits that may be utilized as the sampling systems 142/156 of FIG. 1. A serial differential data signal received from a transmitting component is coupled to differential data inputs INM and INP of samplers integrated with the DFE, and each sampler is clocked by one of the clock signals CLK[3:0] from a multi-phase clock generator. Each sampler resolves samples of the serial data signal at the time of the rising edge of the respective clock signal to a "1" (logic high) or a "0" (logic low) as outputs Q and /Q of the respective sampler.

The determination of whether the differential data signal is sampled as a "1" or a "0" is based on a decision logic level threshold, wherein a signal above the decision logic level threshold is a "1," and a signal below the decision logic level threshold is a "0." Decision feedback equalization involves adjusting the samplers' decision logic level thresholds by using the outputs of the samplers as feedback to other samplers. Each sampler has offset control inputs, and each offset control input that is coupled to another sampler's output is referred to as a tap. Each tap has an associated magnitude indicating the influence of that tap on the adjustment of the sampler's decision logic level threshold.

Figure 3:
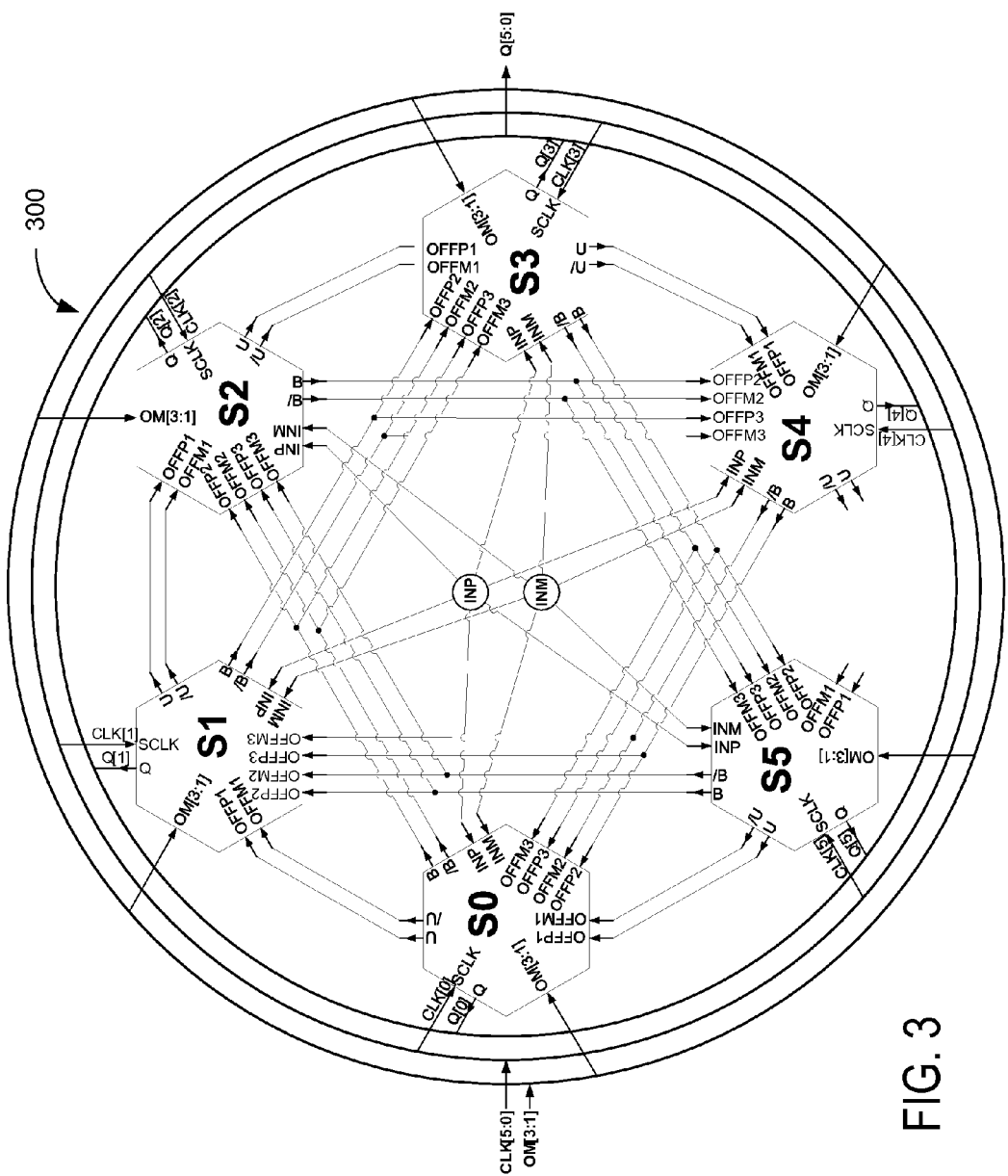
FIG. 3 shows a block diagram of a second example of the data sampling system of FIG. 1.

The DFE circuitry 200 and 300 of FIGS. 2 and 3, respectively, includes sampler circuits (S0-S3 in FIG. 2 and S0-S5 in FIG. 3), representing non-limiting examples of sampling systems 142 and 156 of FIG. 1. In some examples, four samplers each with two differential offset control inputs are utilized, as illustrated in FIG. 2. In other examples, six samplers each with three differential offset control inputs are utilized, as illustrated in FIG. 3. More generally, N samplers each with 1 to integer N/2 offset control inputs may be utilized. Alternatively, embodiments with N samplers having up to N offset control inputs may also be utilized.

Each sampler includes sample clock input SCLK coupled to a sample clock, and the sample clocks of the N samplers are equally spaced in phase through 360 degrees. For example, for X ranging from 0 to N−1, sampler X is coupled to a sample clock having a frequency and having a phase equal to X*360/N degrees. Utilizing N samplers (N being an integer equal to or greater than four) having up to N offset control inputs addresses latency issues that may arise in DFE implementations, in that the relative phases of each clock signal provided to each sampler are spaced such that sampler states may be retained for use by the DFE for up to a full data cycle (360 degrees) of an input signal with no additional storage elements. The use of no additional storage elements also may reduce an area occupied by the sampler/DFE circuitry relative to a circuit that uses additional storage elements.

Each sampler includes a data input having a decision logic level threshold, a plurality of offset control inputs, a plurality of offset magnitude inputs (e.g., a first and second offset control input and a first and second offset magnitude input), an un-buffered output, and a buffered output. In some embodiments, each sampler includes a registered output and a slave latch coupled between the buffered output and the registered output. Each sampler's decision logic level threshold is controlled by the combined action of the sampler's offset control inputs and offset magnitude inputs. The sampler's offset control inputs, un-buffered output, buffered output, and registered output (when it exists) may be configured to utilize complementary signaling, while the sampler's offset control inputs and data input may be configured to utilize differential signaling.

Each sampler further includes circuitry coupled between the inputs and outputs that transitions and exhibits a time delay from an input signal transition to an output signal transition. The time delay can be quantified in units of gate delays. After an offset control input voltage changes, the decision logic level threshold is configured to change within a time substantially less than 1 gate delay, and after the sample clock transitions from low to high, the un-buffered output is configured to transition within a time substantially equal to 1 gate delay and the buffered output is configured to transition within a time substantially equal to 2 gate delays.

As described above, each sampler outputs a plurality of signals suitable for utilization as offset control inputs to other samplers. In some embodiments, for X ranging from 0 to N−1, sampler X's un-buffered outputs U and /U are coupled to the first offset control input of sampler X+1 modulo N+1, and sampler X's buffered outputs B and /B are coupled to the second offset control input of sampler X+2 modulo N+1. Because the sampler un-buffered and buffered outputs remain valid for only ½ of the sample clock cycle, in some embodiments the samplers may include outputs Q and /Q, which are registered and valid for the full clock cycle immediately after the sampler's input clock transition, and can therefore be provided to even later samplers, e.g. to sampler X+3 modulo N+1 in the case of N=4.

Continuing, as illustrated in FIGS. 2 and 3, each sampler receives buffered (B and /B) and un-buffered (U and /U) output signals from other samplers. For example, in the two-tap, four sampler example of FIG. 2, inputs OFFP1 and OFFM1 of sampler S0 receive un-buffered output signals U and /U, respectively, from sampler S3. Inputs OFFP2 and OFFM2 of sampler S0 of FIG. 2 receive buffered output signals B and /B, respectively, from sampler S2. Similarly, sampler S0 of FIG. 2 provides buffered output signals B and /B to sampler S2 and un-buffered output signals U and /U to sampler S1.

In the three tap, six sampler example of FIG. 3, inputs OFFP1 and OFFM1 of sampler S0 receive un-buffered output signals U and /U from sampler S5, and inputs OFFP2, OFFM2, OFFP3, and OFFM3 receive buffered output signals B and /B of samplers S4 and S3, respectively. Similarly, samplers S[1,2,3,4,5] receive at inputs OFFP1 and OFFM1 respective un-buffered signals U and /U from samplers S[0,1,2,3,4], samplers S[1,2,3,4,5] receive at inputs OFFP2 and OFFM2 respective buffered signals B and /B from samplers S[5,0,1,2,3], and samplers S[1,2,3,4,5] receive at inputs OFFP3 and OFFM3 respective buffered signals B and /B from samplers [4,5,0,1,2].

Because the U and /U outputs of a given sampler are un-buffered, circuit loading may make it difficult to use these outputs as feedback to more than one other sampler in an array of samplers. In light of this limitation, the un-buffered outputs U and /U of each sampler S[0,1,2,3,4,5] are used to control only the first offset control input of sampler S[1,2,3,4,5,0], respectively, and the buffered outputs B and /B are used to control the samplers' remaining offset control inputs. In alternative embodiments, registered outputs Q and /Q may be used to control some offset control inputs.

Any suitable voltage may be applied to the offset magnitude inputs of a sampler, wherein the voltage indicates an amount of contribution from that offset control input to an adjustment of the sampler's decision logic level threshold. Each sampler's offset magnitude input is set by a digital value that is converted to an analog value. In typical practice, and so as to achieve appropriate high-pass equalization, a higher offset magnitude is used in conjunction with the offset control inputs that are coupled to the U and /U outputs of the first-preceding (in time) sampler, a lower offset magnitude is used in conjunction with the offset control inputs that are coupled to the B and /B outputs of the second-preceding (in time) sampler, and a still-lower offset magnitude is used in conjunction with the offset control inputs that are coupled to the B and /B outputs of the third-preceding (in time) sampler.

Figure 4:
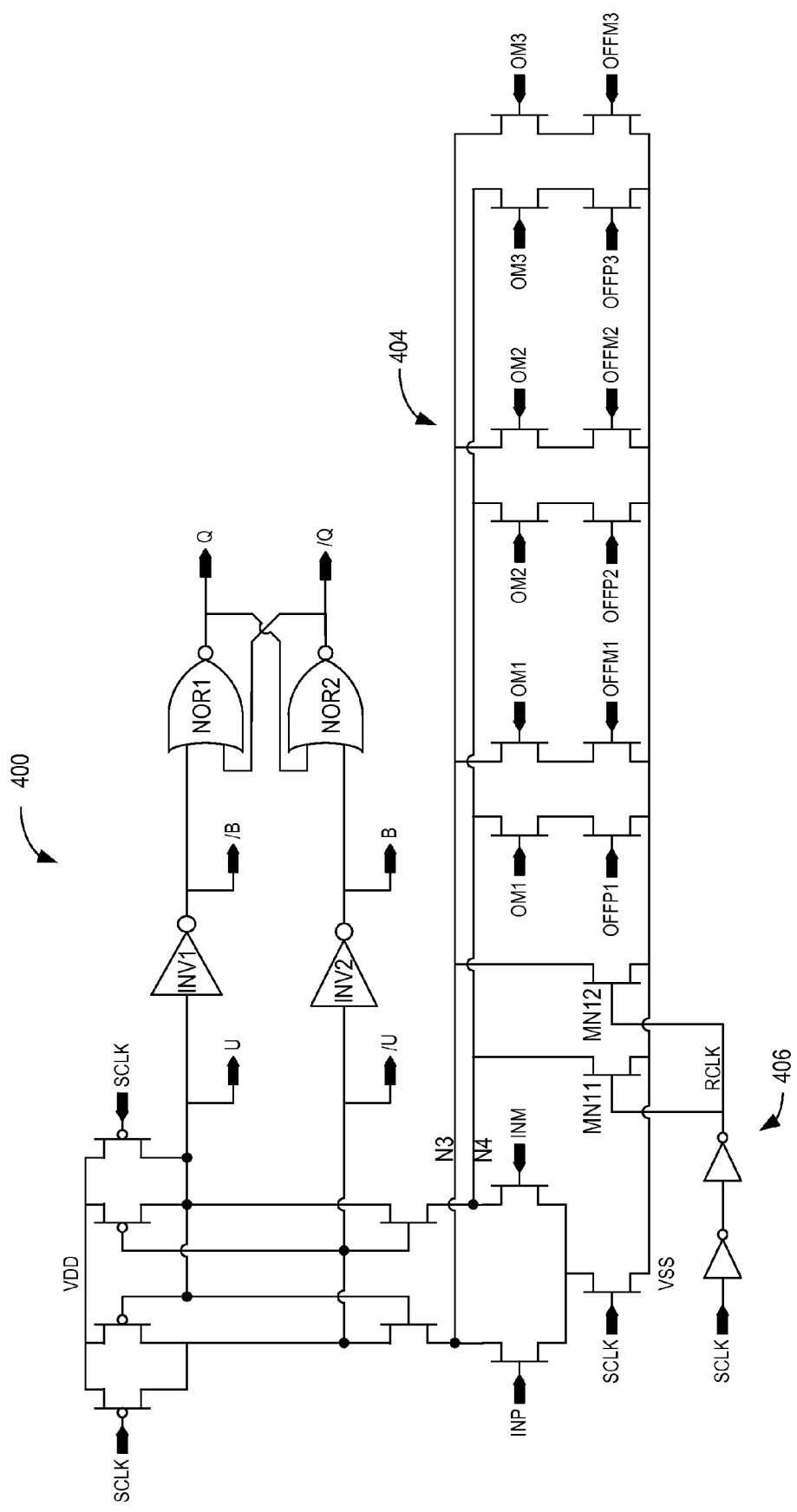
FIG. 4 shows an example circuit diagram of the samplers of FIG. 2 and FIG. 3.

FIG. 4 illustrates an example circuit diagram of a sampler circuit 400, such as any one of sampler circuits S0-S3 of FIG. 2 or S0-S5 of FIG. 3. As shown in FIG. 4, the immediate output of the sampler is captured as U and /U, whereas the B and /B outputs are buffered via inverters INV1 and INV2. Further, in some embodiments, registered outputs Q and /Q may be provided via NOR gates NOR1 and NOR2. Offset currents are drawn from the sampler circuit 400 at nodes N3 and N4, depending on the offset control inputs OFFP[1:3] and OFFM[1:3], and the offset magnitude inputs OM[1:3], and this current results in a positive or negative decision logic level threshold offset having a magnitude that is dependent on the offset control input values and the offset magnitude input values. In an alternative embodiment, the ordering of the offset control inputs and offset magnitude inputs may be reversed, with the drains of transistors coupled to OFFP[1:3] and OFFM[1:3] coupled to nodes N4 and N3, respectively, and the sources of transistors coupled to OM[1:3] coupled to VSS. Additionally in the alternative embodiment, the source of the transistor coupled to OFFP[n] may be coupled to the source of the transistor coupled to OFFM[n] (n=1, 2, 3). The combined effect of resetting a sampler's U and /U output signals high and the use of ground-referenced nfets for offset current generation favorably minimizes the delay between the sampler's sample clock rising edge and the sampler's influence on the decision logic level threshold of the next-trailing (in time) sampler. Clock circuit 406 represents a circuit for generating the RCLK signal, which is input to switches MN11 and MN12 and reduces the time it takes the latch to reach its final state.

A voltage source is coupled to each of the offset magnitude inputs of each sampler, and the sampler's decision logic level threshold is controlled by a combined action of the sampler's offset control inputs and offset magnitude inputs. Thus, when the sampler's sample clock transitions from low to high and its data input signal is greater than its decision logic level threshold, its un-buffered and buffered outputs are configured to transition to a logic high level, and when the sample clock transitions from low to high and the data input signal is less than the sampler's decision logic level threshold, its un-buffered and buffered outputs are configured to transition to a logic low level.

Figure 5:
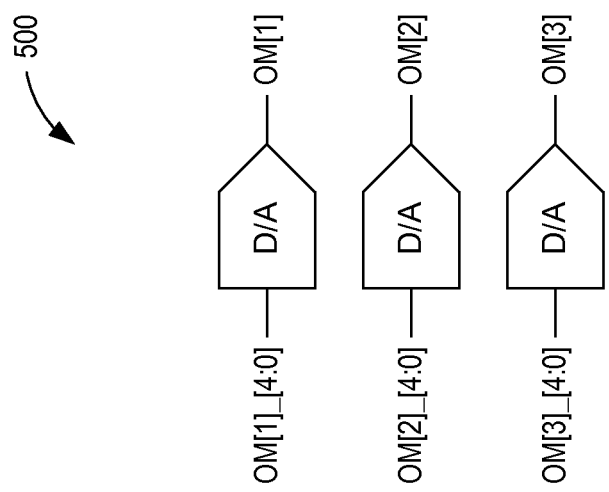
FIG. 5 shows a block diagram of an offset magnitude voltage generator configured to generate offset magnitude voltages from offset magnitude digital input values.

FIG. 5 illustrates a block diagram of an example offset magnitude voltage generator 500 for generating offset magnitude signals OM[3:1] for samplers of a DFE circuit, such as samplers S0-S3 of FIG. 2 and samplers S0-S5 of FIG. 3. The OM signals influence an offset in the samplers' decision logic level threshold, and are set by D/A converters. In FIGS. 2 and 3, signals coupled to each pair of inputs OFFPn and OFFMn (n=1, 2, 3) of a given sampler in FIGS. 2 and 3 come from preceding samplers, are dependent on whether preceding samplers sampled a zero or a one, and in combination with the offset magnitude signals, influence the polarity of the offset in the sampler's decision logic level threshold.

Figure 6:
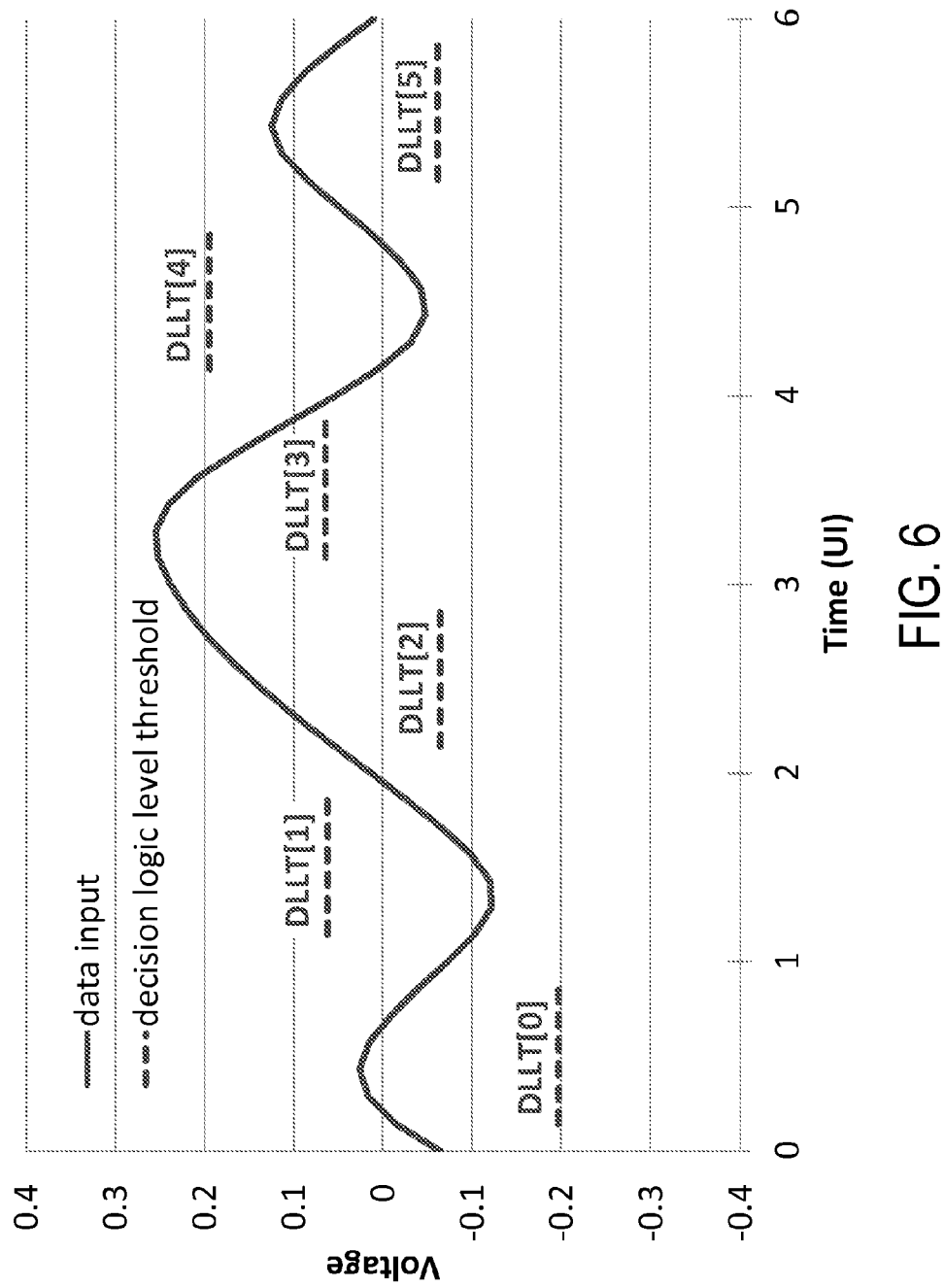
FIG. 6 shows an example data input signal and also illustrates example decision logic level thresholds in accordance with the disclosure.

FIG. 6 is a graph showing an example data input signal and corresponding example decision logic level thresholds relating to operation of the example data sampling system of FIG. 3. Illustrated here is an example response of the decision logic level thresholds DLLT[0:5] of each sampler S[0:5] to the outputs of each sampler's preceding (in time) samplers.

Figure 7:
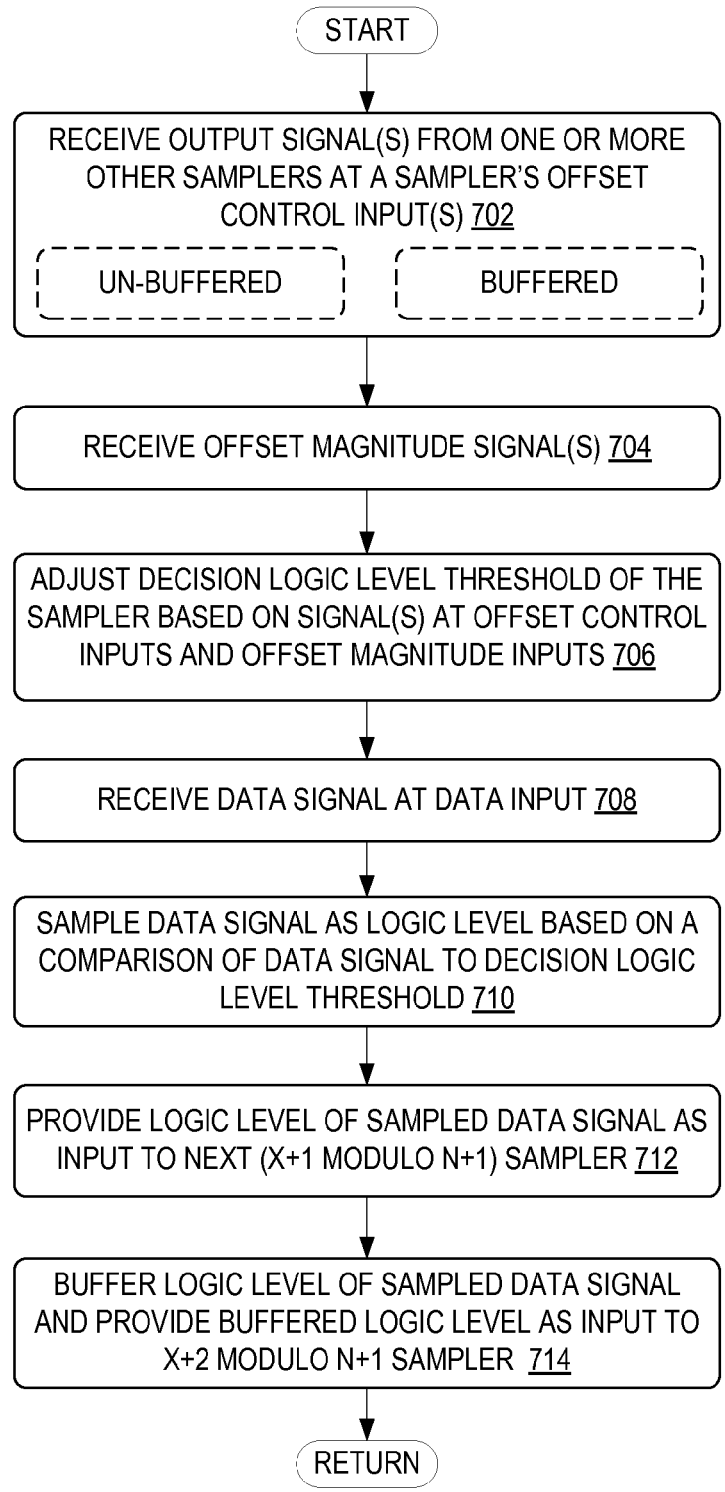
FIG. 7 is a flow chart illustrating an example method 700 of operating a signal sampling system.

FIG. 7 shows a flow chart illustrating an example method 700 of operating a signal sampling system including N latching samplers, such as the data sampling systems of FIGS. 1-4. While presented in the context of a single sampler of a sampling system, it will be understood that method 700 may be performed for each of the N samplers. At 702, method 700 includes receiving, at each of a plurality of offset control inputs, an output signal from another sampler of the N latching samplers. The output signals may include un-buffered output signals and buffered output signals. Further, at 704, method 700 includes receiving, at each of a plurality of offset magnitude inputs, an offset magnitude signal. Example offset control inputs and offset magnitude inputs, and example signals received at these inputs, are described above.

At 706, method 700 includes adjusting the decision logic level threshold of the sampler based upon the signals received at the plurality of offset control inputs and the plurality of offset magnitude inputs. In the example sampler circuits described above, the decision logic level threshold changes within a time substantially less than one gate delay after an offset control input of the sampler transitions from a first voltage to a second voltage. In other sampler circuits, the logic level threshold may change during any suitable time frame.

At 708, method 700 includes receiving, at a data input of the sampler, a data signal, and at 710, sampling the data signal as a logic level based on a comparison of the data signal to the decision logic level threshold. Further, at 712, method 700 includes providing a logic level of the sampled data signal as an input to a next sampler. In the examples described above, the logic level of the sampled data signal is provided as un-buffered output signal to a next sampler (e.g., where the sampler providing the un-buffered output signal is sampler X of N total samplers, the sampler to which the unbuffered output signal is provided is the X+1 modulo N+1 sampler). At 714, the method includes buffering the logic level of the sampled data signal and providing the buffered logic level as an input to the sampler after the next sampler (e.g., sampler X+2 modulo N+1 in the examples above).

Another example provides a signal sampling system comprising N latching samplers, wherein N is an integer equal to or greater than four; each sampler includes a sample clock input to couple to a sample clock, and the sample clocks of the N samplers are substantially equally spaced in phase through 360 degrees; each sampler further includes a data input having a decision logic level threshold, a plurality of offset control inputs, a plurality of offset magnitude inputs, an un-buffered output, and a buffered output; and each sampler further includes circuitry coupled between the inputs and outputs that causes a time delay from an input signal transition to an output signal transition such that, after an offset control input changes from a first voltage to a second voltage, the decision logic level threshold changes in a time substantially less than one gate delay, and after the sample clock transitions from a first logic state to a second logic state, the un-buffered output transitions within a time substantially equal to one gate delay and the buffered output transitions within a time substantially equal to two gate delays. In such an example, for X ranging from 0 to N−1, sampler X may additionally or alternatively be coupled to a sample clock having a frequency and having a phase substantially equal to X*360/N degrees; the plurality of offset control inputs may additionally or alternatively include a first offset control input and the plurality of offset magnitude inputs may additionally or alternatively include a first offset magnitude input; and sampler X's un-buffered output may additionally or alternatively be coupled to the first offset control input of sampler X+1 modulo N+1. In such an example, the plurality of offset control inputs may additionally or alternatively further include a second offset control input and the plurality of offset magnitude inputs may additionally or alternatively include a second offset magnitude input; and sampler X's buffered output may additionally or alternatively be coupled to the second offset control input of sampler X+2 modulo N+1. In such an example, N may additionally or alternatively be an integer equal to or greater than six; the plurality of offset control inputs may additionally or alternatively further include offset control inputs 3 to integer N/2; the plurality of offset magnitude inputs may additionally or alternatively further include offset magnitude inputs 3 to integer N/2; and sampler X's buffered output may additionally or alternatively be coupled to offset control input Y of samplers X+Y modulo N+1, wherein Y ranges from 3 to integer N/2. In such an example, a voltage source may additionally or alternatively be coupled to each of the first and second offset magnitude inputs, and to each of the other offset magnitude inputs from 3 to integer N/2 offset magnitude inputs; and each sampler's decision logic level threshold may additionally or alternatively be controlled by a combined action of the sampler's offset control inputs and offset magnitude inputs. In such an example, each sampler may additionally or alternatively be configured such that, when the sample clock transitions from low to high and the data input signal is greater than the sampler's decision logic level threshold, the un-buffered and buffered outputs transition to a logic high level; and when the sample clock transitions from low to high and the data input signal is less than the sampler's decision logic level threshold, the un-buffered and buffered outputs transition to a logic low level. In such an example, each sampler may additionally or alternatively further include a registered output and a slave latch coupled between the buffered output and the registered output. In such an example, the un-buffered output, buffered output and registered output of the sampler may additionally or alternatively be configured to utilize complementary signaling; and the offset control inputs and data input of the sampler may additionally or alternatively be configured to utilize differential signaling. Any or all of the above-described examples may be combined in any suitable manner in various implementations.

Another example provides a signal sampling system, comprising N latching samplers, wherein N is an integer equal to or greater than four; and a decision feedback equalizer providing communication between the N samplers, the decision feedback equalizer comprising, for each sampler of the N samplers, integer N/2 offset control inputs and integer N/2 offset magnitude inputs that are configured to provide feedback to adjust a decision logic level threshold for the sampler, wherein a first offset control input is coupled to an un-buffered sampler output, and a second offset control input is coupled to a buffered sampler output. In such an example, each offset control input may additionally or alternatively be driven by an offset control signal; each offset magnitude input may additionally or alternatively be driven by an offset magnitude voltage; the offset magnitude input signal may additionally or alternatively be set by a digital value; and the decision logic level threshold may additionally or alternatively be determined by a combined action of the offset control signals and the offset magnitude voltages. In such an example, for X ranging from 0 to N−1, sampler X may additionally or alternatively be coupled to a sample clock having a frequency and having a phase substantially equal to X*360/N degrees; sampler X's un-buffered output may additionally or alternatively be coupled to the first offset control input of sampler X+1 modulo N+1; and sampler X's buffered output may additionally or alternatively be coupled to the second offset control input of sampler X+2 modulo N+1. In such an example, N may additionally or alternatively be an integer equal to or greater than six; and for X ranging from 0 to N−1, sampler X's buffered output may additionally or alternatively be coupled to a third offset control input of sampler X+3 modulo N+1. In such an example, each sampler may additionally or alternatively be configured such that, when the sample clock transitions from low to high and the data input signal is greater than the sampler's decision logic level threshold, the un-buffered and buffered outputs are configured to transition to a logic high level, and when the sample clock transitions from low to high and the data input signal is less than the sampler's decision logic level threshold, the un-buffered and buffered outputs are configured to transition to a logic low level. Any or all of the above-described examples may be combined in any suitable manner in various implementations.

Another example provides a method of operating a signal sampling system including N latching samplers, the method comprising: for each sampler of the N latching samplers, receiving, at each of a plurality of offset control inputs, a buffered output signal or an un-buffered output signal from another sampler of the N latching samplers; receiving, at each of a plurality of offset magnitude inputs, an offset magnitude signal, the offset magnitude signal indicating an amount of contribution from a respective offset control input to an adjustment of a decision logic level threshold of the sampler; adjusting the decision logic level threshold of the sampler based at least on the signals received at the plurality of offset control inputs and the plurality of offset magnitude signals received at the plurality of offset magnitude inputs, where the decision logic level threshold changes within a time substantially less than one gate delay after an offset control input of the sampler transitions from a first voltage to a second voltage; receiving, at a data input of the sampler, a data signal; and sampling the data signal as a logic level based on a comparison of the data signal to the decision logic level threshold. In such an example, the method may additionally or alternatively further comprise, for each sampler of the N latching samplers, providing a plurality of un-buffered output signals and a plurality of buffered output signals to one or more other samplers of the N latching samplers, where the un-buffered output signal transitions within a time substantially equal to one gate delay after the sample clock transitions from a first logic level to a second logic level, and where the buffered output signal transitions within a time substantially equal to two gate delays after the sample clock transitions from the first logic level to the second logic level. In such an example, for X ranging from 0 to N−1, the method may additionally or alternatively further comprise providing the un-buffered output signal of sampler X to an offset control input of sampler X+1 modulo N+1. In such an example, for X ranging from 0 to N−1, the method may additionally or alternatively further comprise providing the buffered output signal of sampler X to an offset control input of sampler X+2 modulo N+1. In such an example, N may additionally or alternatively be an integer equal to or greater than six, and the method may additionally or alternatively further comprise providing the buffered output of sampler X to an offset control input of samplers X+Y modulo N+1, wherein Y ranges from 3 to integer N/2. In such an example, the method may additionally or alternatively further comprise, for each sampler of the N latched samplers, transitioning the un-buffered and buffered output signals of the sampler to a logic high level when a sample clock that is input to the sampler transitions from low to high and the data input signal is greater than the sampler's decision logic level threshold. In such an example, the method may additionally or alternatively further comprise, for each sampler of the N latched samplers, transitioning the un-buffered and buffered output signals of the sampler to a logic low level when a sample clock that is input to the sample transitions from low to high and the data input signal is less than the sampler's decision logic level threshold. Any or all of the above-described examples may be combined in any suitable manner in various implementations.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A signal sampling system comprising N latching samplers, wherein
N is an integer equal to or greater than four;
each sampler of the N latching samplers includes a sample clock input to couple to a sample clock, and the sample clocks of the N latching samplers are spaced in phase through 360 degrees;
each sampler of the N latching samplers further includes a data input having a decision logic level threshold, a plurality of offset control inputs, a plurality of offset magnitude inputs, an un-buffered output, and a buffered output; and
each sampler of the N latching samplers further includes circuitry coupled between the inputs and outputs that causes a time delay from an input signal transition to an output signal transition wherein,
after an offset control input changes from a first voltage to a second voltage, the decision logic level threshold changes in a time less than one gate delay, and
after the sample clock transitions from a first logic state to a second logic state, the un-buffered output transitions within a time substantially equal to one gate delay and the buffered output transitions within a time substantially equal to two gate delays.

2. The signal sampling system of claim 1, wherein for X ranging from 0 to N−1,
sampler X is coupled to a sample clock having a frequency and having a phase of X*360/N degrees;
the plurality of offset control inputs includes a first offset control input and the plurality of offset magnitude inputs includes a first offset magnitude input; and
the un-buffered output of sampler X is coupled to the first offset control input of sampler X+1 modulo N+1.

3. The signal sampling system of claim 2, wherein
the plurality of offset control inputs further includes a second offset control input and the plurality of offset magnitude inputs includes a second offset magnitude input; and
the buffered output of sampler X is coupled to the second offset control input of sampler X+2 modulo N+1.

4. The signal sampling system of claim 3, wherein
N is an integer equal to or greater than six;
the plurality of offset control inputs further includes offset control inputs 3 to integer N/2;
the plurality of offset magnitude inputs further includes offset magnitude inputs 3 to integer N/2; and
the buffered output of sampler X is coupled to offset control input Y of samplers X+Y modulo N+1, wherein Y ranges from 3 to integer N/2.

5. The signal sampling system of claim 4, wherein
a voltage source is coupled to each of the first and second offset magnitude inputs, and to each of the other offset magnitude inputs from 3 to integer N/2 offset magnitude inputs; and
the decision logic level threshold for each sampler of the N latching samplers is controlled by a combined action of the offset control inputs and offset magnitude inputs of the sampler of the N latching samplers.

6. The sampling system of claim 5, wherein
for each latching sampler of the N latching samplers, when the sample clock transitions from low to high and the data input signal is greater than the decision logic level threshold of the sampler of the N latching samplers, the un-buffered and buffered outputs transition to a logic high level; and for each latching sampler of the N latching samplers, when the sample clock transitions from low to high and the data input signal is less than the decision logic level threshold of that sampler of the N latching samplers, the un-buffered and buffered outputs transition to a logic low level.

7. The signal sampling system of claim 6, wherein each sampler of the N latching samplers further includes a registered output and a slave latch coupled between the buffered output and the registered output.

8. The signal sampling system of claim 7, wherein the un-buffered output, buffered output and registered output of each sampler of the N latching samplers are configured to utilize complementary signaling; and
the offset control inputs and data input of each sampler of the N latching samplers are configured to utilize differential signaling.

9. A signal sampling system, comprising
N latching samplers, wherein N is an integer equal to or greater than four; and
a decision feedback equalizer providing communication between the N latching samplers, the decision feedback equalizer comprising, for each sampler of the N latching samplers,
  integer N/2 offset control inputs and integer N/2 offset magnitude inputs that are configured to provide feedback to adjust a decision logic level threshold for the latching sampler of the N latching samplers, wherein
  a first offset control input of the integer N/2 offset control inputs is coupled to an un-buffered sampler output of one or more other samplers of the N latching samplers, and
  a second offset control input of the integer N/2 offset control inputs is coupled to a buffered sampler output of one or more other samplers of the N latching samplers.

10. The signal sampling system of claim 9, wherein
each offset control input is driven by an offset control signal,
each offset magnitude input is driven by an offset magnitude voltage;
the offset magnitude input signal is set by a digital value; and
the decision logic level threshold is determined by a combined action of the offset control signals and the offset magnitude voltages.

11. The signal sampling system of claim 10, wherein for X ranging from 0 to N−1,
sampler X is coupled to a sample clock having a frequency and having a phase of X*360/N degrees;
the un-buffered output of sampler X is coupled to the first offset control input of sampler X+1 modulo N+1; and
the buffered output of sampler X is coupled to the second offset control input of sampler X+2 modulo N+1.

12. The signal sampling system of claim 11, wherein
N is an integer equal to or greater than six; and
for X ranging from 0 to N−1, the buffered output of sampler X is coupled to a third offset control input of sampler X+3 modulo N+1.

13. The sampling system of claim 12, wherein,
for each sampler of the N latching samplers, when the sample clock transitions from low to high and the data input signal is greater than the decision logic level threshold of the sampler of the N latching samplers, the un-buffered and buffered outputs are configured to transition to a logic high level, and for each sampler of the N latching samplers, when the sample clock transitions from low to high and the data input signal is less than the decision logic level threshold of the sampler of the N latching samplers, the un-buffered and buffered outputs are configured to transition to a logic low level.

14. A method of operating a signal sampling system including N latching samplers, the method comprising:
for each sampler of the N latching samplers,
  receiving, at each of a plurality of offset control inputs, a buffered output signal or an un-buffered output signal from another sampler of the N latching samplers;
  receiving, at each of a plurality of offset magnitude inputs, an offset magnitude signal, the offset magnitude signal indicating an amount of contribution from a respective offset control input to an adjustment of a decision logic level threshold of the sampler;
  adjusting the decision logic level threshold of the sampler based at least one of the signals received at the plurality of offset control inputs and the plurality of offset magnitude signals received at the plurality of offset magnitude inputs, where the decision logic level threshold changes within a time less than one gate delay after an offset control input of the sampler transitions from a first voltage to a second voltage;
  receiving, at a data input of the sampler, a data signal; and
  sampling the data signal as a logic level based on a comparison of the data signal to the decision logic level threshold.

15. The method of claim 14, further comprising, for each sampler of the N latching samplers, providing a plurality of un-buffered output signals and a plurality of buffered output signals to one or more other samplers of the N latching samplers, where the un-buffered output signal transitions within a time substantially equal to one gate delay after the sample clock transitions from a first logic level to a second logic level, and where the buffered output signal transitions within a time substantially equal to two gate delays after the sample clock transitions from the first logic level to the second logic level.

16. The method of claim 15, wherein for X ranging from 0 to N−1, the method further comprises providing the un-buffered output signal of sampler X to an offset control input of sampler X+1 modulo N+1.

17. The method of claim 15, wherein for X ranging from 0 to N−1, the method further comprises providing the buffered output signal of sampler X to an offset control input of sampler X+2 modulo N+1.

18. The method of claim 17, wherein N is an integer equal to or greater than six, and wherein the method further comprises providing the buffered output of sampler X to an offset control input of samplers X+Y modulo N+1, wherein Y ranges from 3 to integer N/2.

19. The method of claim 18, further comprising, for each sampler of the N latching samplers, transitioning the un-buffered and buffered output signals of the sampler of the N latching samplers to a logic high level when a sample clock that is input to the sampler transitions from low to high and the data input signal is greater than the decision logic level threshold of the sampler of the N latching samplers.

20. The method of claim 18, further comprising, for each sampler of the N latching samplers, transitioning the un-buffered and buffered output signals of the sampler of the N latching samplers to a logic low level when a sample clock that is input to the sampler transitions from low to high and the data input signal is less than the decision logic level threshold of the sampler of the N latching samplers.

* * * * *